(12) United States Patent
Lei et al.

(10) Patent No.: US 11,555,244 B2
(45) Date of Patent: Jan. 17, 2023

(54) HIGH TEMPERATURE DUAL CHAMBER SHOWERHEAD

(71) Applicant: APPLIED MATERIALS, INC., Santa Clara, CA (US)

(72) Inventors: Pingyan Lei, San Jose, CA (US); Dien-Yeh Wu, San Jose, CA (US); Jallepally Ravi, San Ramon, CA (US); Takashi Kuratomi, San Jose, CA (US); Xiaoxiong Yuan, San Jose, CA (US); Manjunatha Koppa, Bengaluru (IN); Vinod Konda Purathe, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/078,664

(22) Filed: Oct. 23, 2020

(65) Prior Publication Data
US 2021/0130956 A1 May 6, 2021

Related U.S. Application Data

(60) Provisional application No. 62/930,996, filed on Nov. 5, 2019.

(51) Int. Cl.
*C23C 16/40* (2006.01)
*C23C 16/455* (2006.01)

(52) U.S. Cl.
CPC .............................. *C23C 16/45565* (2013.01)

(58) Field of Classification Search
CPC ........ C23C 16/45565; C23C 16/45574; C23C 16/4405
USPC ................... 118/715; 156/345.33, 345.34
See application file for complete search history.

(56) References Cited

U.S. PATENT DOCUMENTS

| | | | |
|---|---|---|---|
| 6,302,964 B1 * | 10/2001 | Umotoy | C23C 16/45574 118/715 |
| 6,508,197 B1 | 1/2003 | Omstead et al. | |
| 9,057,128 B2 * | 6/2015 | Olgado | C23C 16/45572 |
| 10,546,729 B2 | 1/2020 | Lubomirsky | |
| 2018/0122647 A1 | 5/2018 | Kuratomi et al. | |
| 2019/0177851 A1 * | 6/2019 | Ivanov | C23C 16/45574 |

OTHER PUBLICATIONS

International Search Report for PCT/US2020/057362, dated Feb. 19, 2021.

* cited by examiner

*Primary Examiner* — Rudy Zervigon
(74) *Attorney, Agent, or Firm* — Moser Taboada

(57) ABSTRACT

Embodiments of showerheads are provided herein. In some embodiments, a showerhead for use in a process chamber includes a gas distribution plate having an upper surface and a lower surface; a plurality of channels extending through the gas distribution plate substantially perpendicular to the lower surface; a plurality of first gas delivery holes extending from the upper surface to the lower surface between adjacent channels of the plurality of channels to deliver a first process gas through the gas distribution plate; and a plurality of second gas delivery holes extending from the plurality of channels to the lower surface to deliver a second process gas therethrough without mixing with the first process gas.

20 Claims, 5 Drawing Sheets

HIGH TEMPERATURE DUAL CHAMBER SHOWERHEAD

CROSS-REFERENCE TO RELATED APPLICATIONS

This application claims benefit of U.S. provisional patent application Ser. No. 62/930,996, filed Nov. 5, 2019 which is herein incorporated by reference in its entirety.

FIELD

Embodiments of the present disclosure generally relate to semiconductor processing equipment.

BACKGROUND

Substrate processing equipment generally includes process chambers configured to perform certain processes on a substrate, for example, chemical vapor deposition (CVD), atomic layer deposition (ALD), etching, or the like. Process chambers may use showerheads to dispense process gases over substrates when performing certain processes. Often, multiple process gases are dispensed through the showerheads. However, the inventors have observed that conventional showerheads are not adequate for dispensing multiple process gases through showerheads for certain high temperature applications.

Accordingly, the inventors have provided embodiments of improved showerheads as disclosed herein.

SUMMARY

Embodiments of showerheads for use in substrate process chambers are provided herein. In some embodiments, a showerhead for use in a process chamber includes a gas distribution plate having an upper surface and a lower surface; a plurality of channels extending entirely through the gas distribution plate substantially perpendicular to the lower surface; a plurality of first gas delivery holes extending from the upper surface to the lower surface between adjacent channels of the plurality of channels to deliver a first process gas through the gas distribution plate; and a plurality of second gas delivery holes extending from the plurality of channels to the lower surface to deliver a second process gas therethrough without mixing with the first process gas.

In some embodiments, a showerhead for use in a process chamber includes a gas distribution plate having an upper surface and a lower surface; a plurality of channels extending through the gas distribution plate substantially perpendicular to the lower surface; a first flange having a lower surface coupled to the gas distribution plate, wherein the first flange has an annular shape to define a first gas flow path therein; a plurality of first gas delivery holes extending through the gas distribution plate to deliver a first process gas from the first gas flow path to the lower surface of the gas distribution plate; a second flange having an annular shape and coupled to the gas distribution plate, wherein the first flange and the second flange define a second gas flow path therebetween; and a plurality of second gas delivery holes extending from the plurality of channels to the lower surface to deliver a second process gas from the second gas flow path to the lower surface of the gas distribution plate without mixing with the first process gas.

In some embodiments, a process chamber includes a chamber body having an interior volume; a substrate support disposed in the interior volume; a showerhead disposed in the interior volume opposite the substrate support, wherein the showerhead includes a gas distribution plate having an upper surface and a lower surface; a plurality of channels extending across the gas distribution plate; a plurality of first gas delivery holes extending from the upper surface to the lower surface between the plurality of channels to deliver a first process gas therethrough; and a plurality of second gas delivery holes extending from the plurality of channels to the lower surface to deliver a second process gas therethrough without mixing with the first process gas in the showerhead.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
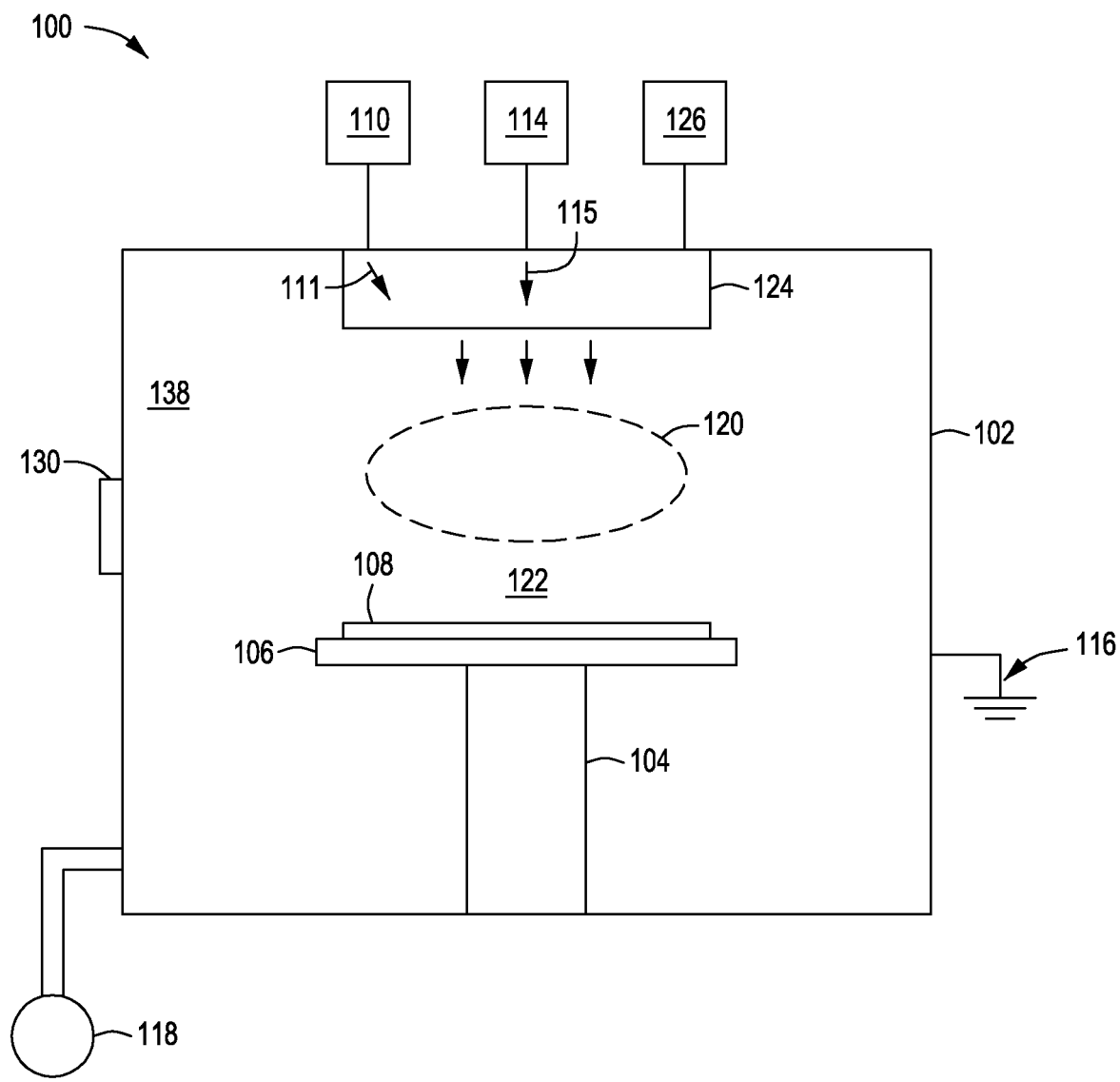
FIG. 1 is a schematic side view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of showerheads for use in substrate process chambers are provided herein. In some embodiments, a showerhead includes a gas distribution plate. In some embodiments, the gas distribution plate can advantageously be made of nickel, nickel alloy, or stainless steel for high temperature applications. In some embodiments, the showerheads provided herein may be used with process gases having a temperature of 300 degrees Celsius (C) or greater. In some embodiments, the showerheads provided herein may be used with process gases having a temperature of 500 degrees C. or greater.

FIG. 1 is a schematic side view of a process chamber 100 in accordance with some embodiments of the present disclosure. The process chamber 100 is a vacuum chamber which is suitably adapted to maintain sub-atmospheric pressures within an interior volume 138 during substrate processing. The process chamber 100 has a chamber body 102 with a processing volume 122. The chamber body 102 may be made of metal, such as aluminum. The chamber body 102 may be grounded via a coupling to ground 116.

The chamber body 102 includes a slit valve 130 to facilitate transferring a substrate 108 into and out of the interior volume 138. The substrate 108 rests on a substrate support 106 which is held up by a shaft 104. The shaft 104 may be hollow to provide a conduit, for example, for power, fluid, process gases, backside gases, coolants, or the like to be provided to the substrate support 106. A showerhead 124 is coupled to the chamber body 102 and is generally opposite the substrate support 106. During a plasma enhanced deposition process, one or more process gases are flowed into the interior volume 138 via the showerhead 124. For example, a first process gas 111 is flowed through the showerhead 124 from a first process gas source 110. In some embodiments, a second process gas 115 is flowed through the showerhead 124 from a second process gas source 114. In some embodiments, the first process gas 111 and the second process gas 115 may be kept separate until entering the processing volume 122. The showerhead 124 includes a plurality of gas distribution holes to provide the first and second process gases to the processing volume 122.

In some embodiments, the first process gas 111 and the second process gas 115 comprise hydrogen gas ($H_2$), titanium chloride ($TiCl_4$), nitrogen trifluoride ($NF_3$), nitrogen gas ($N_2$), or silane ($SiH_4$). In some embodiments, at least one of the first process gas 111 and the second process gas 115 includes a gas mixture having an inert gas. In some embodiments, the inert gas is argon. In some embodiments, the first process gas 111 or the second process gas 115 includes a treatment gas, such as silane ($SiH_4$), to remove unwanted species from walls of the chamber body 102 and the substrate 108 during deposition. The treatment gas may be excited in a plasma and then used to reduce or remove residual content inside the chamber. In some embodiments, the treatment gas may be used without a plasma.

The one or more process gases flowed into the interior volume 138 via the showerhead 124 may be ignited into a plasma 120 by using RF power from an RF power source 126. The plasma 120 interacts with the substrate 108 in the processing volume 122. After deposition, the processing volume 122 may be purged by pump 118 to remove deposition gases and molecules. The purging process may include flowing an inert gas or the treatment gas.

The process chamber 100 is representative and may, for example, be a plasma enhanced atomic layer deposition (PEALD) chamber, a plasma enhanced chemical vapor deposition (PECVD) chamber, or the like. The ability to use a single chamber with the above described processes reduces processing time, consumable materials, and complexity during semiconductor manufacturing. The showerhead 124 described herein may be referred to as dual channel showerhead (DCSH). The showerhead 124 may allow for flowable deposition of a dielectric material, and separation of precursor and processing fluids during operation. The showerhead may alternatively be utilized for etching processes that allow for separation of etchants outside of the reaction zone to provide limited interaction with chamber components and each other prior to being delivered into the processing region. The showerhead as described herein can also suitably be used in other applications where desirable to provide process gases in two separate sets of channels as described herein.

Figure 2:
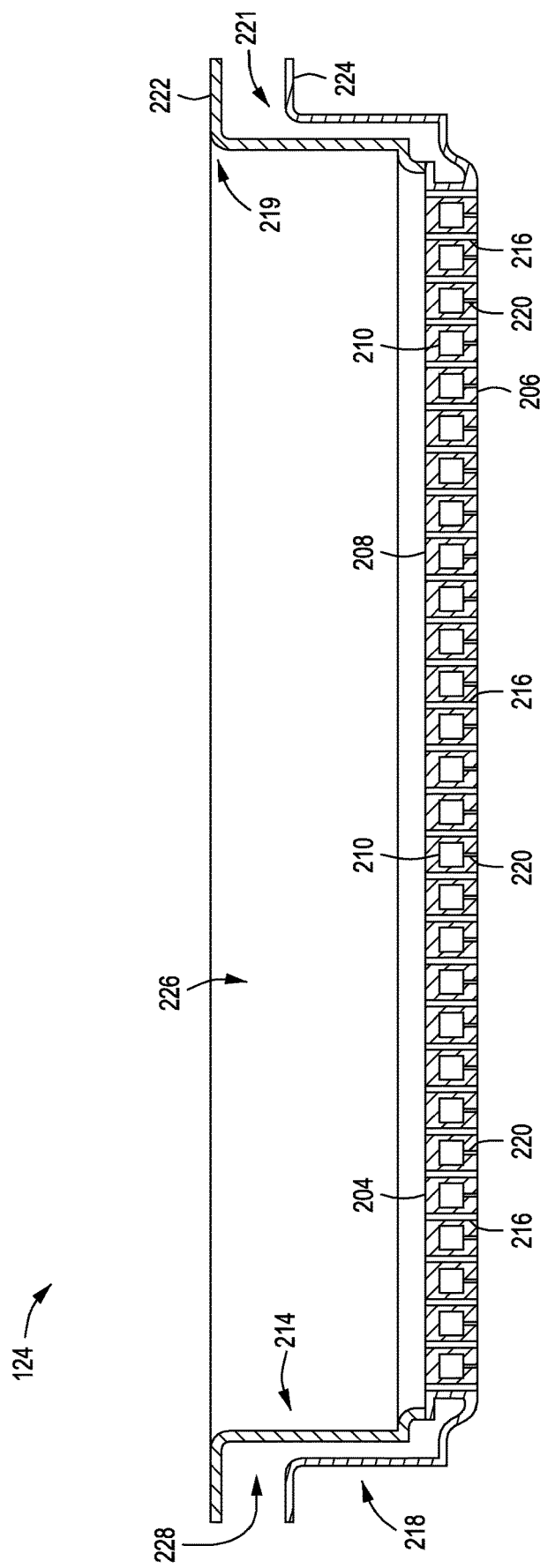
FIG. 2 is a cross-sectional side view of a portion of a showerhead in accordance with some embodiments of the present disclosure.

FIG. 2 is a cross-sectional side view of a showerhead in accordance with some embodiments of the present disclosure. The showerhead 124 includes a gas distribution plate 204 having an upper surface 208 and a lower surface 206. In some embodiments, the gas distribution plate 204 is disk-shaped. In some embodiments, the gas distribution plate 204 is made of metal. In some embodiments, the gas distribution plate 204 is made of nickel, nickel alloy, or stainless steel. In some embodiments, the gas distribution plate 204 is made of a nickel-chromium alloy such as Inconel®.

The gas distribution plate 204 includes a plurality of channels 210 extending across and through the gas distribution plate 204. In some embodiments the plurality of channels 210 have a substantially uniform cross-sectional area. In some embodiments, the plurality of channels 210 are disposed at regular intervals across the gas distribution plate 204. In some embodiments, the plurality of channels 210 are disposed centrally between the upper surface 208 and the lower surface 206. In some embodiments, the plurality of channels 210 extend substantially parallel to the lower surface 206.

The gas distribution plate 204 includes a plurality of first gas delivery holes 216 extending through the gas distribution plate 204 from the upper surface 208 to the lower surface 206. The plurality of first gas delivery holes 216 are fluidly isolated from the plurality of channels 210. In some embodiments, the plurality of first gas delivery holes 216 extend between adjacent channels of the plurality of channels 210 to deliver a first process gas (e.g., the first process gas 111) through the gas distribution plate 204 (e.g., from a gas source and through the gas distribution plate from a first side of the gas distribution plate to a second side of the gas distribution plate).

A plurality of second gas delivery holes 220 extend from the plurality of channels 210 to the lower surface 206 to deliver a second process gas (e.g., the second process gas 115) therethrough without mixing with the first process gas.

The showerhead 124 includes a first flange 214 coupled to the gas distribution plate 204. In some embodiments, the first flange 214 is coupled to the gas distribution plate 204 proximate the upper surface 208. The first flange 214 extends upward, away from the upper surface 208. In some embodiments, an upper portion 219 of the first flange 214 includes a first lip 222 extending radially outward. In some embodiments, the first flange 214 includes a substantially vertical portion disposed between the first lip 222 and gas distribution plate 204.

The showerhead 124 includes a second flange 218 coupled to the gas distribution plate 204. In some embodiments, the second flange 218 is coupled proximate the lower surface 206. In some embodiments, the plurality of channels 210 are disposed between the first flange 214 and the second flange 218. In some embodiments, the second flange 218 extends upward, away from the upper surface 208. In some embodiments, an upper portion 221 of the second flange 218 includes a second lip 224 extending radially outward. In some embodiments, the second flange 218 includes a substantially vertical portion disposed between the second lip 224 and gas distribution plate 204. In some embodiments, the first flange 214 and the second flange 218 are made of a material having a coefficient of thermal conductivity of less than about 20 W/mK to reduce heat transfer between the first process fluid and the second process fluid. In some embodiments, the first flange 214 and the second flange 218 are made of a nickel alloy or stainless steel. In some embodiments, the first flange 214 and the second flange 218 is made of any of the materials discussed above with respect to the gas distribution plate 204. In some embodiments, the first flange 214 and the second flange 218 have a thickness of about 20 mil to about 100 mil.

In some embodiments, the first flange 214 has an annular shape to define a first gas flow path 226 therein to provide the first process gas to the plurality of first gas delivery holes 216. In some embodiments, the first flange 214 and the second flange 218 define a second gas flow path 228 therebetween to provide the second process gas to the plurality of second gas delivery holes 220 via the plurality of channels 210.

Figure 3A:
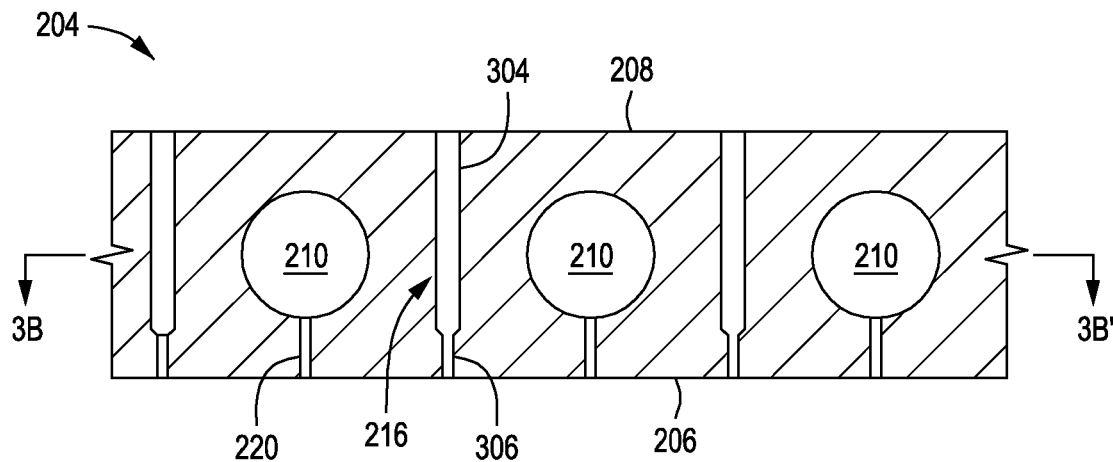
FIG. 3A is a cross-sectional side view of a portion of a showerhead in accordance with some embodiments of the present disclosure.
Figure 3B:
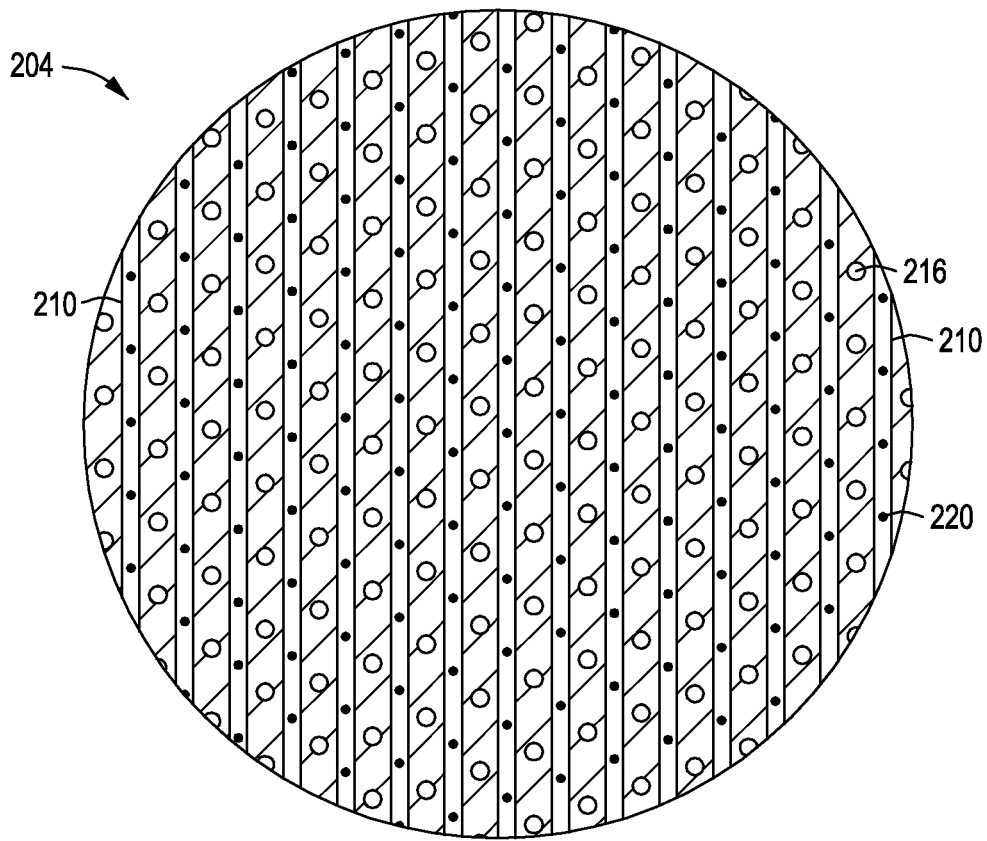
FIG. 3B is a cross-sectional top view of a larger portion of the showerhead of FIG. 3A taken along line 3B-3B'.

FIG. 3A is a cross-sectional side view of a portion of the showerhead 124 in accordance with some embodiments of the present disclosure. FIG. 3B is a cross-sectional top view of a larger portion of the showerhead 124 of FIG. 3A taken along line 3B-3B'. In some embodiments, as shown in FIGS. 3A and 3B, the gas distribution plate 204 is made of a single plate. In some embodiments, the gas distribution plate 204 is drilled to create the plurality of channels 210. In some embodiments, all channels of the plurality of channels 210 extend substantially parallel to each other. In some embodiments, the plurality of channels 210 have a circular cross-sectional shape. Although FIG. 3B, shows the plurality of channels 210 as linear and arranged at regular intervals across the gas distribution plate 204, the plurality of channels 210 may be arranged in other suitable patterns.

In some embodiments, each hole of the plurality of first gas delivery holes 216 include an upper portion 304 and a lower portion 306. In some embodiments, the upper portion 304 has a diameter greater than a diameter of the lower portion 306 to choke the flow therethrough to provide more uniform flow of the first process gas through the plurality of first gas delivery holes 216. In some embodiments, the diameter of the lower portion 306 is substantially similar to a diameter of the plurality of second gas delivery holes 220.

Figure 4A:
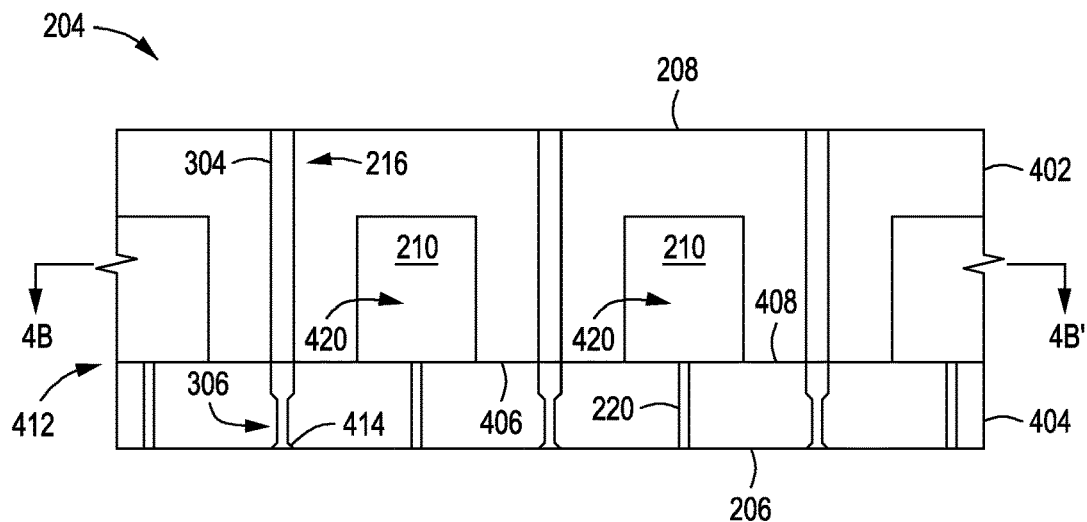
FIG. 4A is a cross-sectional side view of a portion of a showerhead in accordance with some embodiments of the present disclosure.
Figure 4B:
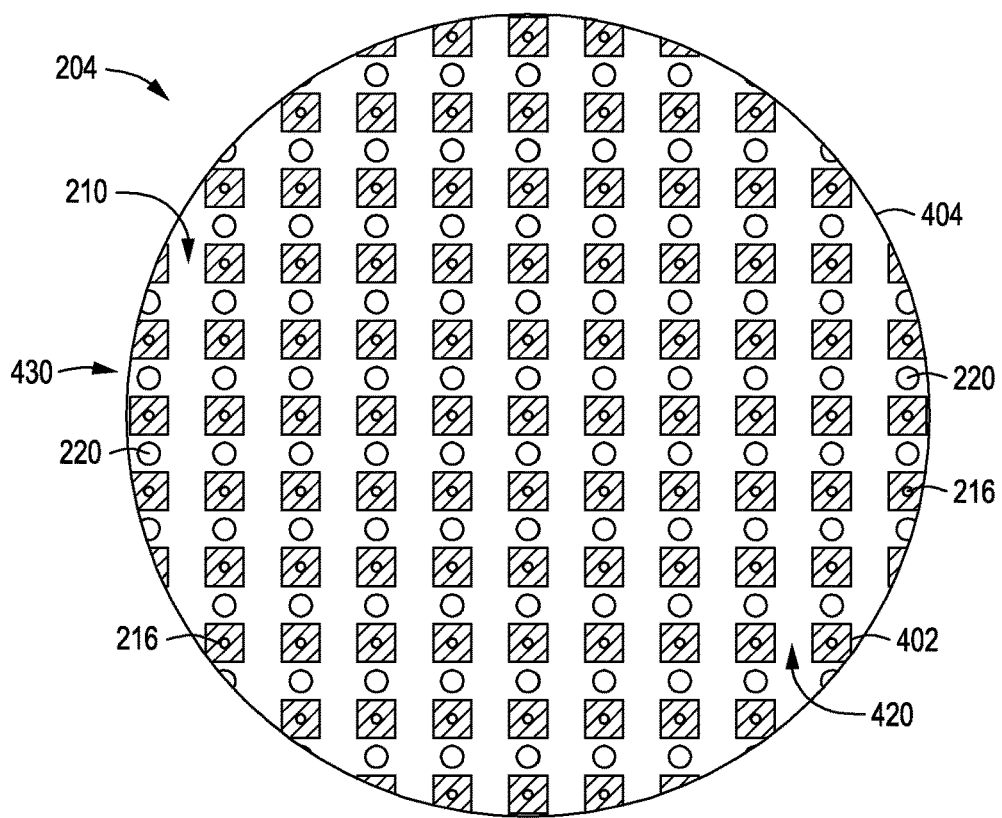
FIG. 4B is a cross-sectional top view of a larger portion of the showerhead of FIG. 4A taken along line 4B-4B'.

FIG. 4A is a cross-sectional side view of a portion of the showerhead 124 in accordance with some embodiments of the present disclosure. FIG. 4B is a cross-sectional top view of a larger portion of the showerhead 124 of FIG. 4A taken along line 4B-4B'. In some embodiments, the gas distribution plate 204 comprises two or more plates brazed together. For example, as shown in FIGS. 4A and 4B, the gas distribution plate 204 includes a first plate 402 coupled to a second plate 404. In some embodiments, a lower surface 406 of the first plate 402 is brazed to an upper surface 408 of the second plate 404 at an interface 412. In some embodiments, the interface 412 is substantially parallel to the lower surface 206. The first plate 402 defines the upper surface 208. The second plate 404 defines the lower surface 206. In some embodiments, the plurality of channels 210 are disposed in the first plate 402. In some embodiments, the plurality of second gas delivery holes 220 are disposed in the second plate 404.

Embodiments with the gas distribution plate 204 comprising two or more plates advantageously allows for the plurality of channels 210 to have more complex patterns and cross-sectional shapes. For example, in some embodiments, the plurality of channels 210 include a plurality of first channels 420 and a plurality of second channels 430. In some embodiments, the plurality of first channels 420 are substantially parallel to each other and substantially perpendicular to the plurality of second channels 430. In some embodiments, the plurality of first channels 420 may be angled with respect to the plurality of second channels 430.

In some embodiments, the plurality of channels 210 have a rectangular cross-sectional shape. In some embodiments, the plurality of first gas delivery holes 216 includes a nozzle portion 414 coupled to a lower end of the lower portion 306. The nozzle portion 414 increases in diameter from the lower portion 306 to the lower surface 206 of the gas distribution plate 204 to increase a spray area of the first process gas. Although not shown, the plurality of second gas delivery holes 220 may include a similar nozzle portion.

Figure 5:
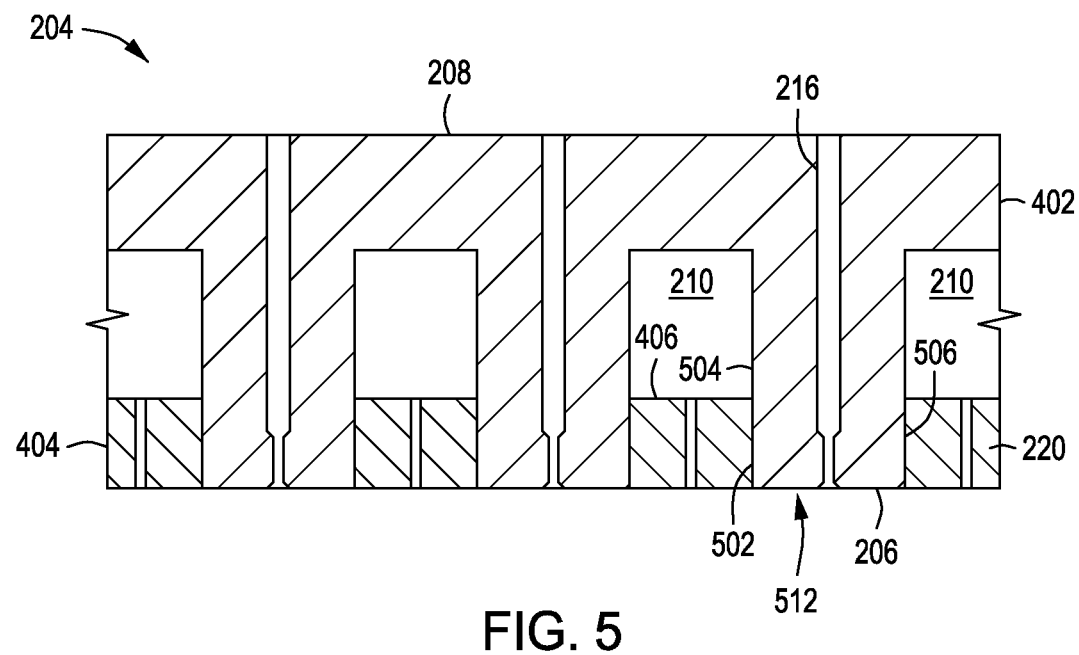
FIG. 5 is a cross-sectional side view of a portion of a showerhead in accordance with some embodiments of the present disclosure.

FIG. 5 is a cross-sectional side view of a portion of a showerhead in accordance with some embodiments of the present disclosure. In some embodiments, the first plate 402 extends from the upper surface 208 of the gas distribution plate 204 to the lower surface 206 of the gas distribution plate 204. In such embodiments, the first plate 402 may be brazed to the second plate 404 at or proximate the lower surface 206.

In some embodiments, a lower portion 512 of the first plate 402 extends through a plurality of openings 506 of the second plate 404. The lower portion 512 is shaped to mate with the plurality of openings 506. In such embodiments, the plurality of first gas delivery holes 216 extend through the first plate 402 and within the plurality of openings 506 of the second plate 404. In some embodiments, the lower surface of the first plate 402 is coplanar with a lower surface of the second plate 404. In some embodiments, sidewalls 504 of the first plate 402 that define the plurality of channels 210 are substantially coplanar with sidewalls 502 of the lower portion 512.

Figure 6:
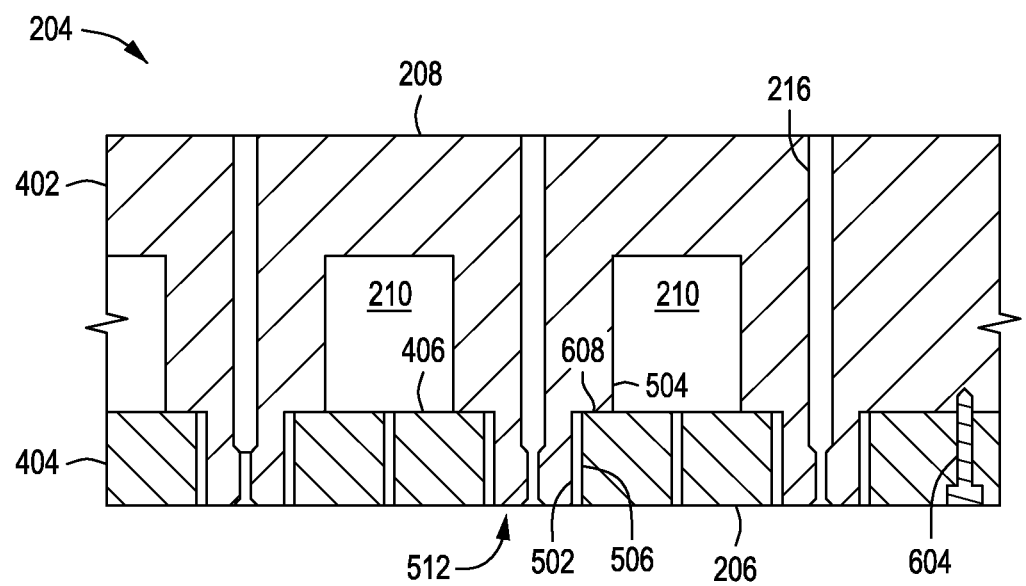
FIG. 6 is a cross-sectional side view of a portion of a showerhead in accordance with some embodiments of the present disclosure.

FIG. 6 is a cross-sectional side view of a portion of a showerhead in accordance with some embodiments of the present disclosure. In some embodiments, as shown in FIG. 6, the first plate 402 is coupled to the second plate 404 via fasteners 604. In some embodiments, the first plate 402 includes a step 608 between the sidewalls 504 defining the plurality of channels 210 and sidewalls 502 of the lower portion 512. The step 608 advantageously provides a surface for the second plate 404 to rest against to seal the plurality of channels 210 when the second plate 404 is fastened to the first plate 402.

While the foregoing is directed to embodiments of the present disclosure, other and further embodiments of the disclosure may be devised without departing from the basic scope thereof.

The invention claimed is:

1. A showerhead for use in a process chamber, comprising:
   a gas distribution plate having an upper surface and a lower surface;
   a plurality of channels extending entirely through the gas distribution plate substantially parallel to the lower surface;
   a first flange extending radially outward and upward from the upper surface of the gas distribution plate;
   a plurality of first gas delivery holes extending from the upper surface to the lower surface between adjacent channels of the plurality of channels, and wherein a first flow path to deliver a first process gas extends between inner sidewalls of the first flange and through the plurality of first gas delivery holes, and wherein the inner sidewalls are disposed radially outward of the plurality of channels; and
   a plurality of second gas delivery holes extending from the plurality of channels to the lower surface to deliver a second process gas therethrough without mixing with the first process gas.

2. The showerhead of claim 1, wherein the gas distribution plate is made of nickel, nickel alloy, or stainless steel.

3. The showerhead of claim 1, further comprising:
a second flange extending radially outward and upward from the lower surface of the gas distribution plate and spaced from the first flange to define an annular channel therebetween to deliver the second process gas between the first flange and the second flange to the plurality of channels.

4. The showerhead of claim 3, wherein the first flange and the second flange extend radially outward from the gas distribution plate, then vertically upward, and then radially outward.

5. The showerhead of claim 1, wherein the gas distribution plate includes a first plate defining the upper surface and a second plate at least partially defining the lower surface of the gas distribution plate, wherein the plurality of channels are disposed in the first plate, and wherein the plurality of second gas delivery holes are disposed in the second plate.

6. The showerhead of claim 5, wherein a lower surface of the first plate is substantially coplanar with a lower surface of the second plate.

7. The showerhead of claim 5, wherein the first plate extends through a plurality of openings of the second plate, and wherein the plurality of first gas delivery holes extend through the first plate within the plurality of openings of the second plate.

8. The showerhead of claim 5, wherein a lower surface of the first plate is coupled to an upper surface of the second plate.

9. The showerhead of claim 5, wherein the first plate is coupled to the second plate via fasteners.

10. A showerhead for use in a process chamber, comprising:
a gas distribution plate having an upper surface and a lower surface;
a plurality of channels extending through the gas distribution plate substantially parallel to the lower surface;
a first flange having a lower surface coupled to an outer sidewall of the gas distribution plate and extending radially outward and upward from the gas distribution plate, wherein the first flange has an annular shape to define a first gas flow path therein;
a plurality of first gas delivery holes extending through the gas distribution plate to deliver a first process gas from the first gas flow path to the lower surface of the gas distribution plate;
a second flange having an annular shape and coupled to the gas distribution plate, wherein the first flange and the second flange define a second gas flow path therebetween, wherein the second gas flow path includes a first portion that extends horizontally outward from the gas distribution plate, a second portion that extends vertically upward from the first portion, and a third portion that extends horizontally outward from the second portion; and
a plurality of second gas delivery holes extending from the plurality of channels to the lower surface to deliver a second process gas from the second gas flow path to the lower surface of the gas distribution plate without mixing with the first process gas.

11. The showerhead of claim 10, wherein first flange and the second flange are made of Inconel or stainless steel.

12. The showerhead of claim 10, wherein the first flange and the second flange have a thickness of about 20 mil to about 100 mil.

13. The showerhead of claim 10, wherein the gas distribution plate is made of nickel, nickel alloy, or stainless steel.

14. The showerhead of claim 10, wherein the plurality of channels include a plurality of first channels and a plurality of second channels, wherein the plurality of first channels are substantially perpendicular to the plurality of second channels.

15. A process chamber, comprising:
a chamber body having an interior volume;
a substrate support disposed in the interior volume;
a showerhead disposed in the interior volume opposite the substrate support, wherein the showerhead comprises:
a gas distribution plate having an upper surface and a lower surface;
a plurality of channels extending across the gas distribution plate;
a plurality of first gas delivery holes extending from the upper surface to the lower surface between the plurality of channels to deliver a first process gas therethrough;
first flange coupled to the gas distribution plate proximate the upper surface;
a second flange coupled to the gas distribution plate proximate the lower surface, wherein the first flange and the second flange define an annular channel therebetween; and
a plurality of second gas delivery holes extending from the plurality of channels to the lower surface to deliver a second process gas therethrough from an outermost sidewall of the gas distribution plate without mixing with the first process gas in the showerhead.

16. The process chamber of claim 15, wherein the second flange defines an outermost sidewall of the showerhead.

17. The process chamber of claim 15, wherein the gas distribution plate is made of nickel, nickel alloy, or stainless steel.

18. The process chamber of claim 15, wherein the gas distribution plate includes a first plate defining the upper surface and a second plate defining the lower surface, wherein the plurality of channels are disposed in the first plate, and wherein the plurality of second gas delivery holes are disposed in the second plate.

19. The process chamber of claim 15, wherein all channels of the plurality of channels extend substantially parallel to each other.

20. The process chamber of claim 15, wherein the plurality of channels include a plurality of first channels and a plurality of second channels, wherein the plurality of first channels are substantially perpendicular to the plurality of second channels.

* * * * *